(12) United States Patent
Arami et al.

(10) Patent No.: US 9,653,357 B2
(45) Date of Patent: May 16, 2017

(54) PLASMA ETCHING APPARATUS

(71) Applicant: DISCO CORPORATION, Tokyo (JP)

(72) Inventors: Junichi Arami, Tokyo (JP); Kenji Okazaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 379 days.

(21) Appl. No.: 14/325,876

(22) Filed: Jul. 8, 2014

(65) Prior Publication Data

US 2015/0020973 A1    Jan. 22, 2015

(30) Foreign Application Priority Data

Jul. 16, 2013    (JP) .................................. 2013-147544

(51) Int. Cl.
| | |
|---|---|
| *H01L 21/82* | (2006.01) |
| *H01L 21/67* | (2006.01) |
| *H01J 37/32* | (2006.01) |
| *H01L 21/3065* | (2006.01) |

(52) U.S. Cl.
CPC .......... *H01L 21/82* (2013.01); *H01J 37/3244* (2013.01); *H01L 21/3065* (2013.01); *H01L 21/67069* (2013.01); *H01J 2237/334* (2013.01)

(58) Field of Classification Search
CPC ................. H01L 21/82; H01L 21/3065; H01L 21/67069; H01J 37/3244; H01J 2237/334
USPC ........................................ 156/345.1; 118/715
See application file for complete search history.

(56) References Cited

U.S. PATENT DOCUMENTS

| | | | | |
|---|---|---|---|---|
| 4,142,004 A | * | 2/1979 | Hauser, Jr. ............ | C23C 16/345 118/725 |
| 5,203,956 A | * | 4/1993 | Hansen ................... | C23C 16/08 118/715 |
| 5,763,010 A | * | 6/1998 | Guo ....................... | C23C 16/401 257/E21.241 |
| 5,810,937 A | * | 9/1998 | Gupta ................... | B08B 7/0035 134/1.1 |
| 5,865,205 A | * | 2/1999 | Wilmer ................ | G05D 7/0635 137/2 |
| 5,895,530 A | * | 4/1999 | Shrotriya ............ | C23C 16/4412 118/715 |
| 5,968,324 A | * | 10/1999 | Cheung ................... | G03F 7/091 204/192.28 |

(Continued)

FOREIGN PATENT DOCUMENTS

WO    WO 03/071591    8/2003

*Primary Examiner* — Rudy Zervigon
(74) *Attorney, Agent, or Firm* — Green Burns & Crain, Ltd.

(57) ABSTRACT

A plasma etching apparatus includes: a housing defining a plasma processing chamber; a workpiece retaining unit disposed within the plasma processing chamber of the housing and retaining a workpiece on an upper surface of the workpiece retaining unit; a processing gas injecting unit injecting a processing gas for plasma generation onto the workpiece retained by the workpiece retaining unit, the processing gas injecting unit including a processing gas jetting portion; a processing gas supply unit supplying the processing gas to the processing gas injecting unit; and a pressure reducing unit reducing a pressure within the plasma processing chamber. The processing gas jetting portion of the processing gas injecting unit includes a central injecting portion and a peripheral injecting portion surrounding the central injecting portion.

13 Claims, 5 Drawing Sheets

(56) References Cited

U.S. PATENT DOCUMENTS

| | | | | |
|---|---|---|---|---|
| 6,068,703 A * | 5/2000 | Chen | B01F 5/064 | 118/715 |
| 6,090,206 A * | 7/2000 | Bang | F16K 5/12 | 118/715 |
| 6,103,601 A * | 8/2000 | Lee | C23C 16/401 | 257/E21.241 |
| 6,117,244 A * | 9/2000 | Bang | C23C 16/4401 | 118/715 |
| 6,287,980 B1 * | 9/2001 | Hanazaki | H01L 21/67069 | 156/345.28 |
| 6,303,501 B1 * | 10/2001 | Chen | C23C 16/08 | 137/3 |
| 6,436,193 B1 * | 8/2002 | Kasai | C23C 16/455 | 118/715 |
| 6,511,718 B1 * | 1/2003 | Paz de Araujo | B05D 1/007 | 257/E21.009 |
| 6,530,992 B1 * | 3/2003 | Yang | H01L 21/67017 | 118/695 |
| 6,586,343 B1 * | 7/2003 | Ho | H01L 21/67017 | 118/719 |
| 6,599,574 B1 * | 7/2003 | Yieh | C23C 16/401 | 257/E21.275 |
| 6,632,322 B1 * | 10/2003 | Gottscho | H01J 37/3244 | 118/715 |
| 6,645,884 B1 * | 11/2003 | Yang | C23C 16/4412 | 438/584 |
| 6,829,056 B1 * | 12/2004 | Barnes | H01J 37/32935 | 118/708 |
| 6,913,031 B2 * | 7/2005 | Nawata | G05D 7/0635 | 137/12 |
| 7,335,396 B2 * | 2/2008 | Carpenter | C23C 16/45525 | 118/692 |
| 7,431,859 B2 * | 10/2008 | Bera | H01J 37/321 | 156/345.34 |
| 7,540,971 B2 * | 6/2009 | Bera | H01J 37/321 | 156/345.34 |
| 7,779,785 B2 * | 8/2010 | Miya | C23C 16/345 | 118/696 |
| 7,846,497 B2 * | 12/2010 | Gold | C23C 16/4412 | 137/1 |
| 7,896,967 B2 * | 3/2011 | Hayasaka | C23C 16/455 | 118/696 |
| 7,994,019 B1 * | 8/2011 | Kweskin | C23C 16/401 | 257/296 |
| 8,008,596 B2 * | 8/2011 | Koshiishi | H01J 37/32009 | 118/723 I |
| 8,075,789 B1 * | 12/2011 | Littau | C23C 16/4405 | 134/1.1 |
| 8,176,871 B2 * | 5/2012 | Okuda | C23C 16/45538 | 118/663 |
| 8,221,638 B2 * | 7/2012 | Mizusawa | C23C 16/45557 | 216/58 |
| 8,236,708 B2 * | 8/2012 | Kweskin | C23C 16/401 | 257/E21.278 |
| 8,453,600 B2 * | 6/2013 | Miyashita | C23C 16/345 | 118/723 E |
| 8,476,142 B2 * | 7/2013 | Kweskin | H01L 21/67017 | 438/427 |
| 8,524,580 B2 * | 9/2013 | Akae | C23C 16/345 | 118/724 |
| 8,590,484 B2 * | 11/2013 | Sato | C23C 16/34 | 118/695 |
| 8,664,127 B2 * | 3/2014 | Bhatia | H01L 21/02126 | 438/786 |
| 8,716,154 B2 * | 5/2014 | Bhatia | C23C 16/402 | 438/790 |
| 8,997,686 B2 * | 4/2015 | Ding | C23C 16/448 | 118/695 |
| 2001/0016674 A1 * | 8/2001 | Pang | B01J 19/249 | 588/309 |
| 2002/0048969 A1 * | 4/2002 | Suzuki | C23C 16/401 | 438/778 |
| 2002/0090467 A1 * | 7/2002 | Ramiah | C23C 16/505 | 427/569 |
| 2002/0195423 A1 * | 12/2002 | Patel | B81C 1/00476 | 216/73 |
| 2003/0102008 A1 * | 6/2003 | Sandhu | H01L 21/67069 | 134/1.3 |
| 2003/0111438 A1 * | 6/2003 | Mukai | C23C 16/401 | 216/2 |
| 2004/0031564 A1 * | 2/2004 | Gottscho | H01J 37/3244 | 156/345.24 |
| 2004/0112539 A1 * | 6/2004 | Larson | H01L 21/67017 | 156/345.33 |
| 2005/0178332 A1 * | 8/2005 | Arno | B08B 7/0035 | 118/723 R |
| 2006/0021703 A1 * | 2/2006 | Umotoy | C23C 16/45565 | 156/345.34 |
| 2006/0088666 A1 * | 4/2006 | Kobrin | B05D 1/60 | 427/569 |
| 2006/0130744 A1 * | 6/2006 | Clark | C23C 16/45544 | 117/86 |
| 2006/0213441 A1 * | 9/2006 | Kobrin | B05D 1/60 | 118/715 |
| 2007/0151668 A1 * | 7/2007 | Mizusawa | C23C 16/45557 | 156/345.29 |
| 2007/0158025 A1 * | 7/2007 | Larson | C23C 16/45561 | 156/345.26 |
| 2007/0175391 A1 * | 8/2007 | Mizusawa | C23C 16/455 | 118/689 |
| 2007/0181181 A1 * | 8/2007 | Mizusawa | C23C 16/45565 | 137/1 |
| 2007/0181255 A1 * | 8/2007 | Hayasaka | C23C 16/455 | 156/345.33 |
| 2007/0187363 A1 * | 8/2007 | Oka | H01J 37/32449 | 216/59 |
| 2007/0247075 A1 * | 10/2007 | Kim | H01J 37/321 | 315/111.21 |
| 2007/0251642 A1 * | 11/2007 | Bera | H01J 37/32082 | 156/345.26 |
| 2007/0254483 A1 * | 11/2007 | Bera | H01J 37/3244 | 438/689 |
| 2007/0254486 A1 * | 11/2007 | Bera | H01J 37/32091 | 438/706 |
| 2008/0223523 A1 * | 9/2008 | Handa | H01J 37/32091 | 156/345.44 |
| 2009/0191337 A1 * | 7/2009 | Mizusawa | C23C 16/45557 | 427/248.1 |
| 2010/0125424 A1 * | 5/2010 | Ding | G01F 25/0053 | 702/47 |
| 2010/0140077 A1 * | 6/2010 | Koo | H01J 37/08 | 204/164 |
| 2011/0265883 A1 * | 11/2011 | Cruse | H01J 37/3244 | 137/8 |
| 2012/0073672 A1 * | 3/2012 | Ding | C23C 16/448 | 137/14 |
| 2012/0132367 A1 * | 5/2012 | Tezuka | H01J 37/32091 | 156/345.33 |
| 2012/0244715 A1 * | 9/2012 | Lebouitz | H01L 21/32135 | 438/706 |
| 2013/0008607 A1 * | 1/2013 | Matsumoto | H01J 37/32238 | 156/345.41 |
| 2013/0014895 A1 * | 1/2013 | Kawamata | H01J 37/32091 | 156/345.33 |
| 2013/0312663 A1 * | 11/2013 | Khosla | C23C 16/4485 | 118/710 |
| 2013/0323935 A1 * | 12/2013 | Suzuki | H01L 21/02271 | 438/778 |
| 2014/0116620 A1 * | 5/2014 | Kuwabara | C23C 16/509 | 156/345.24 |
| 2014/0234992 A1 * | 8/2014 | Kubota | H01L 21/76811 | 438/9 |
| 2014/0273486 A1 * | 9/2014 | Katsunuma | H01J 37/32082 | 438/710 |
| 2015/0020973 A1 * | 1/2015 | Arami | H01J 37/3244 | 156/345.29 |
| 2015/0064924 A1 * | 3/2015 | Takaba | H01L 21/0276 | 438/717 |

(56) References Cited

U.S. PATENT DOCUMENTS

| | | | |
|---|---|---|---|
| 2015/0152551 A1* | 6/2015 | Yamaguchi | C23C 16/45565 438/785 |
| 2015/0228457 A1* | 8/2015 | Yamashita | H01L 21/3065 216/67 |
| 2015/0228462 A1* | 8/2015 | Yoshimura | B01J 19/088 156/345.51 |
| 2015/0243524 A1* | 8/2015 | Kihara | H01L 21/31144 438/694 |
| 2016/0035541 A1* | 2/2016 | Kozuka | H01J 37/32091 156/345.33 |
| 2016/0056021 A1* | 2/2016 | Tsujimoto | H01J 37/32091 438/710 |
| 2016/0111258 A1* | 4/2016 | Taskar | H01J 37/32449 156/345.24 |
| 2016/0177446 A1* | 6/2016 | Saido | C23C 16/45548 118/704 |
| 2016/0201193 A1* | 7/2016 | Saido | C23C 16/455 118/715 |

\* cited by examiner

PLASMA ETCHING APPARATUS

BACKGROUND OF THE INVENTION

Field of the Invention

The present invention relates to a plasma etching apparatus for removing a chip and the like formed on the periphery of a semiconductor device by plasma etching.

Description of the Related Art

For example, in a semiconductor device manufacturing process, devices such as ICs and LSIs are formed in a plurality of regions divided by predetermined division lines formed in a lattice manner on the front surface of a semiconductor wafer in substantially a disk shape, and the respective regions in which the devices are formed are divided along the predetermined division lines, whereby individual semiconductor devices are manufactured. A cutting device is typically used as a dividing device for dividing the semiconductor wafer. The cutting device cuts the semiconductor wafer along the predetermined division lines by a cutting blade having a thickness of about 20 µm. The thus divided semiconductor devices are packaged, and widely used in electric apparatuses such as portable telephones and personal computers.

However, the cutting device performs the cutting processing by a rotating cutting blade. Thus, small chips and stress occur in the peripheries of the semiconductor devices, and decrease the transverse rupture strength of the devices. In order to solve such a problem, a method has been proposed which divides a semiconductor wafer along predetermined division lines by plasma etching, and thereby obtains semiconductor devices without chips or stress occurring in the peripheries of the semiconductor devices (see Japanese Patent No. 4447325, for example).

SUMMARY OF THE INVENTION

However, in the method of dividing a semiconductor wafer along predetermined division lines by plasma etching, an etching rate is varied, and thus uniform etching cannot be performed along a plurality of predetermined division lines.

It is accordingly an object of the present invention to provide a plasma etching apparatus capable of uniformly etching a workpiece such as a semiconductor wafer along a plurality of division lines.

In accordance with an aspect of the present invention, there is provided a plasma etching apparatus including: a housing defining a plasma processing chamber; workpiece retaining means for retaining a workpiece on an upper surface of the workpiece retaining means, the workpiece retaining means being disposed within the plasma processing chamber; processing gas injecting means for injecting a processing gas for plasma generation onto the workpiece retained by the workpiece retaining means, the processing gas injecting means having a processing gas jetting portion including a central injecting portion and a peripheral injecting portion surrounding the central injecting portion; processing gas supply means for supplying the processing gas to the processing gas injecting means, the processing gas supply means including a processing gas supply source, a buffer tank communicating with the processing gas supply source and temporarily containing the processing gas, a central injecting portion supply path making the buffer tank and the central injecting portion communicate with each other, a peripheral injecting portion supply path making the buffer tank and the peripheral injecting portion communicate with each other, a first high-frequency opening and closing valve disposed in the central injecting portion supply path, a second high-frequency opening and closing valve disposed in the peripheral injecting portion supply path, and control means for controlling an opening and closing frequency of the first high-frequency opening and closing valve and an opening and closing frequency of the second high-frequency opening and closing valve; and pressure reducing means for reducing a pressure within the plasma processing chamber.

Preferably, the processing gas supply means includes a first processing gas supply source supplying a first processing gas, a second processing gas supply source supplying a second processing gas, gas mixing means for mixing the first processing gas and the second processing gas with each other, a processing gas communicating path making the gas mixing means and the buffer tank communicate with each other, and pressure adjusting means for adjusting a pressure of the processing gas to be supplied to the buffer tank, the pressure adjusting means being disposed in the processing gas communicating path.

Preferably, a plurality of processing gas supply means are provided, and the control means controls the opening and closing frequency of the first high-frequency opening and closing valve and the opening and closing frequency of the second high-frequency opening and closing valve, the first high-frequency opening and closing valve and the second high-frequency opening and closing valve being disposed respectively in the central injecting portion supply path and the peripheral injecting portion supply path of each processing gas supply means.

In the plasma etching apparatus according to the present invention, the processing gas jetting portion of the processing gas injecting means includes the central injecting portion and the peripheral injecting portion surrounding the central injecting portion. The processing gas supply means includes the processing gas supply source, the buffer tank communicating with the processing gas supply source and temporarily containing the processing gas, the central injecting portion supply path making the buffer tank and the central injecting portion communicate with each other, the peripheral injecting portion supply path making the buffer tank and the peripheral injecting portion communicate with each other, the first high-frequency opening and closing valve disposed in the central injecting portion supply path, the second high-frequency opening and closing valve disposed in the peripheral injecting portion supply path, and the control means for controlling the opening and closing frequencies of the first high-frequency opening and closing valve and the second high-frequency opening and closing valve. Hence, the processing gas injected into the plasma processing chamber is supplied from the central injecting portion and the peripheral injecting portion at the predetermined opening and closing frequencies. The processing gas injected into the plasma processing chamber is therefore agitated sufficiently. Thus, an etching rate can be made uniform in each part of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
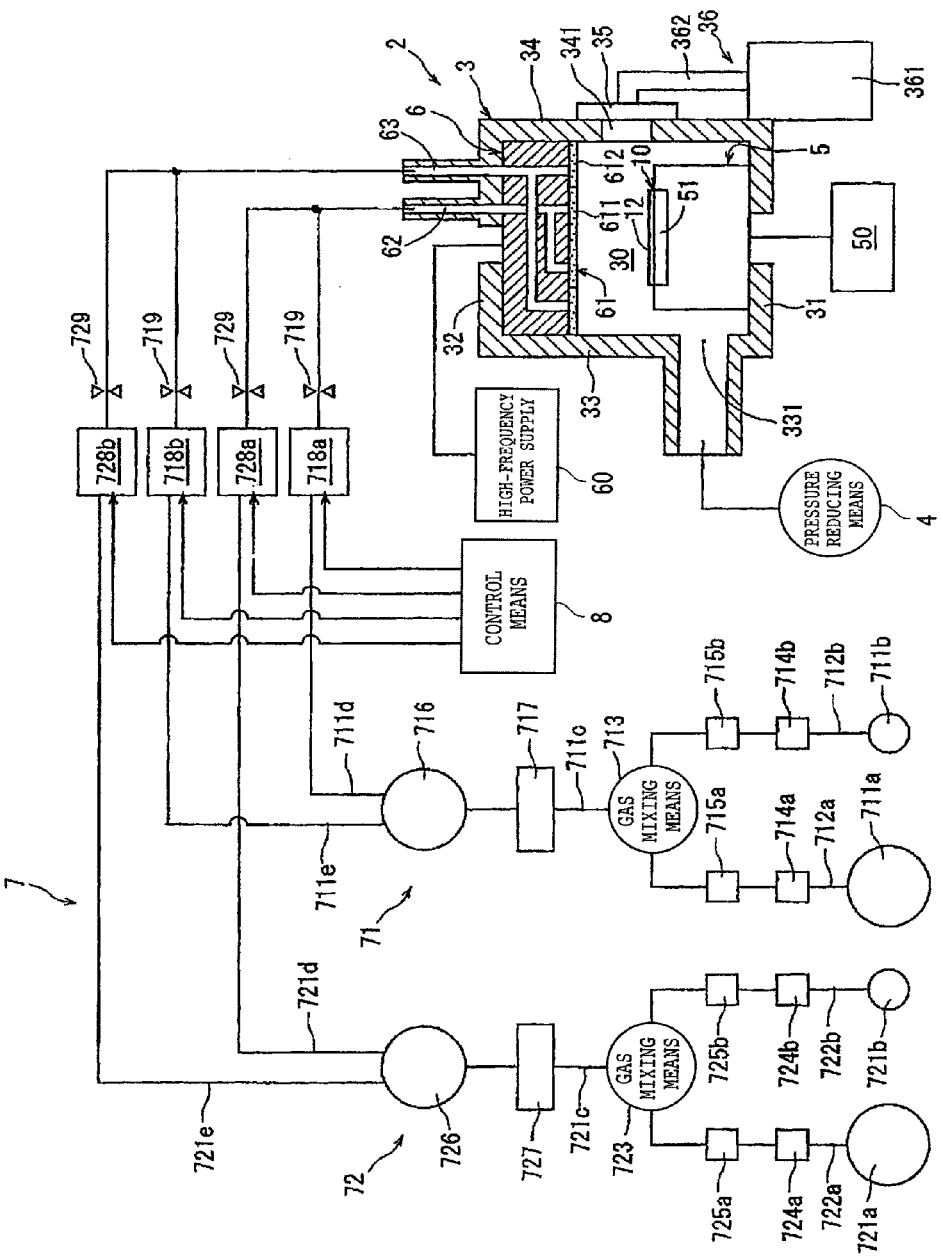
FIG. 1 is a sectional view of principal parts of a plasma etching apparatus constructed according to the present invention.

A preferred embodiment of a plasma etching apparatus constructed according to the present invention will hereinafter be described in detail with reference to the accompanying drawings. FIG. 1 shows a sectional view of principal parts of a plasma etching apparatus 2 constructed according to the present invention. The plasma etching apparatus 2 shown in FIG. 1 has a housing 3 forming a plasma processing chamber 30. The housing 3 is constituted of a bottom wall 31, an upper wall 32, a left side wall 33, a right side wall 34, a rear side wall (not shown), and a front side wall (not shown). An opening 341 for carrying in and out a workpiece is provided in the right side wall 34. A gate 35 for opening and closing the opening 341 is disposed on the outside of the opening 341 so as to be movable in a vertical direction. This gate 35 is actuated by gate actuating means 36. The gate actuating means 36 includes an air cylinder 361 and a piston rod 362 coupled to a piston (not shown) disposed within the air cylinder 361. An end (upper end in FIG. 1) of the piston rod 362 is coupled to the gate 35. The gate actuating means 36 opens the gate 35 to thereby allow a workpiece to be carried in and out through the opening 341. In addition, an exhaust port 331 is provided in the left side wall 33 forming the housing 3. The exhaust port 331 is connected to pressure reducing means 4.

Disposed in the plasma processing chamber 30 formed by the housing 3 are a first electrode unit 5 as workpiece retaining means disposed on the bottom wall 31 and a second electrode unit 6 as processing gas injecting means disposed so as to be opposed to the first electrode unit 5. A circular workpiece retaining table 51 for retaining a workpiece is provided in an upper surface of the first electrode unit 5 as the workpiece retaining means. Incidentally, the workpiece retaining table 51 is provided with an electrostatic chuck. A high-frequency power supply 50 applies a high-frequency power of 50 w with a frequency of 13 MHz to the thus formed first electrode unit 5.

Provided on a lower surface of the second electrode unit 6 as the processing gas injecting means is a processing gas jetting portion 61 that is disposed so as to be opposed to the workpiece retaining table 51 of the first electrode unit 5 and which has jetting ports for jetting processing gases for plasma generation toward the workpiece retaining table 51. The processing gas jetting portion 61 includes a circular central injecting portion 611 and an annular peripheral injecting portion 612 surrounding the central injecting portion 611. In addition, a first passage 62 communicating with the central injecting portion 611 and a second passage 63 communicating with the peripheral injecting portion 612 are formed in the second electrode unit 6. A high-frequency power supply 60 applies a high-frequency power of 3000 w with a frequency of 13 MHz to the thus formed second electrode unit 6.

The plasma etching apparatus 2 includes processing gas supply means 7 for supplying processing gases for plasma generation to the second electrode unit 6. The processing gas supply means 7 includes first processing gas supply means 71 and second processing gas supply means 72 for supplying respective different processing gases for plasma generation to the second electrode unit 6. The first processing gas supply means 71 includes a first processing gas supply source 711a for supplying a $SF_6$ gas as a first processing gas and a second processing gas supply source 711b for supplying an $O_2$ gas as a second processing gas. The first processing gas supply source 711a and the second processing gas supply source 711b communicate with gas mixing means 713 via gas passages 712a and 712b, respectively. Solenoid opening and closing valves 714a and 714b and flow control valves 715a and 715b are disposed in the gas passages 712a and 712b, respectively. Hence, when the solenoid opening and closing valves 714a and 714b are opened, the $SF_6$ gas as the first processing gas and the $O_2$ gas as the second processing gas flow from the first processing gas supply source 711a and the second processing gas supply source 711b into the gas mixing means 713 via the flow control valves 715a and 715b, respectively, and are mixed with each other.

The gas mixing means 713 communicates with a buffer tank 716 via a processing gas communicating path 711c. The buffer tank 716 temporarily stores a processing gas supplied from the gas mixing means 713. Pressure adjusting means 717 for adjusting the pressure of the processing gas to be supplied to the buffer tank 716 is disposed in the processing gas communicating path 711c that makes the gas mixing means 713 and the buffer tank 716 communicate with each other. Hence, the processing gas stored in the buffer tank 716 is maintained in a predetermined pressure range.

The buffer tank 716 communicates with the first passage 62 and the second passage 63 formed in the second electrode unit 6 via a central injecting portion supply path 711d and a peripheral injecting portion supply path 711e. A first diaphragm valve 718a and a second diaphragm valve 718b as a first high-frequency opening and closing valve and a second high-frequency opening and closing valve, respectively, and throttle valves 719 are disposed in the central injecting portion supply path 711d and the peripheral injecting portion supply path 711e, respectively.

The second processing gas supply means 72 has an essentially similar configuration to that of the first processing gas supply means 71 except that the first processing gas is different. Specifically, the second processing gas supply means 72 includes a first processing gas supply source 721a for supplying a $C_4F_8$ gas as a first processing gas and a second processing gas supply source 721b for supplying an $O_2$ gas as a second processing gas. The first processing gas supply source 721a and the second processing gas supply source 721b communicate with gas mixing means 723 via gas passages 722a and 722b, respectively. Solenoid opening and closing valves 724a and 724b and flow control valves 725a and 725b are disposed in the gas passages 722a and 722b, respectively.

The gas mixing means 723 communicates with a buffer tank 726 via a processing gas communicating path 721c. The buffer tank 726 temporarily stores a processing gas supplied from the gas mixing means 723. Pressure adjusting means 727 for adjusting the pressure of the processing gas to be supplied to the buffer tank 726 is disposed in the processing gas communicating path 721c that makes the gas mixing means 723 and the buffer tank 726 communicate with each other. Hence, the processing gas stored in the buffer tank 726 is maintained in a predetermined pressure range.

The buffer tank 726 communicates with the first passage 62 and the second passage 63 formed in the second electrode unit 6 via a central injecting portion supply path 721d and a peripheral injecting portion supply path 721e. A first diaphragm valve 728a and a second diaphragm valve 728b as a first high-frequency opening and closing valve and a second high-frequency opening and closing valve, respectively, and throttle valves 729 are disposed in the central injecting portion supply path 721d and the peripheral injecting portion supply path 721e, respectively.

The plasma etching apparatus 2 includes control means 8. The control means 8 controls the opening and closing frequencies of the first diaphragm valves 718a and 728a and the second diaphragm valves 718b and 728b as the first high-frequency opening and closing valves and the second high-frequency opening and closing valves described above. The control means 8 also controls the gate actuating means 36, the pressure reducing means 4, the high-frequency power supply 50, the high-frequency power supply 60, the solenoid opening and closing valves 714a and 714b, the solenoid opening and closing valves 724a and 724b, and the like.

Figure 2:
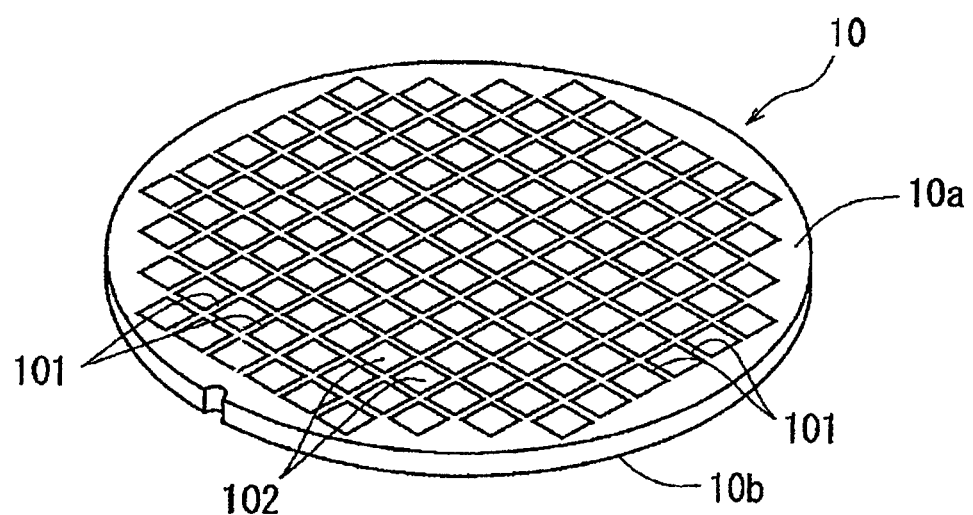
FIG. 2 is a perspective view of a semiconductor wafer as a workpiece.
Figure 3A:
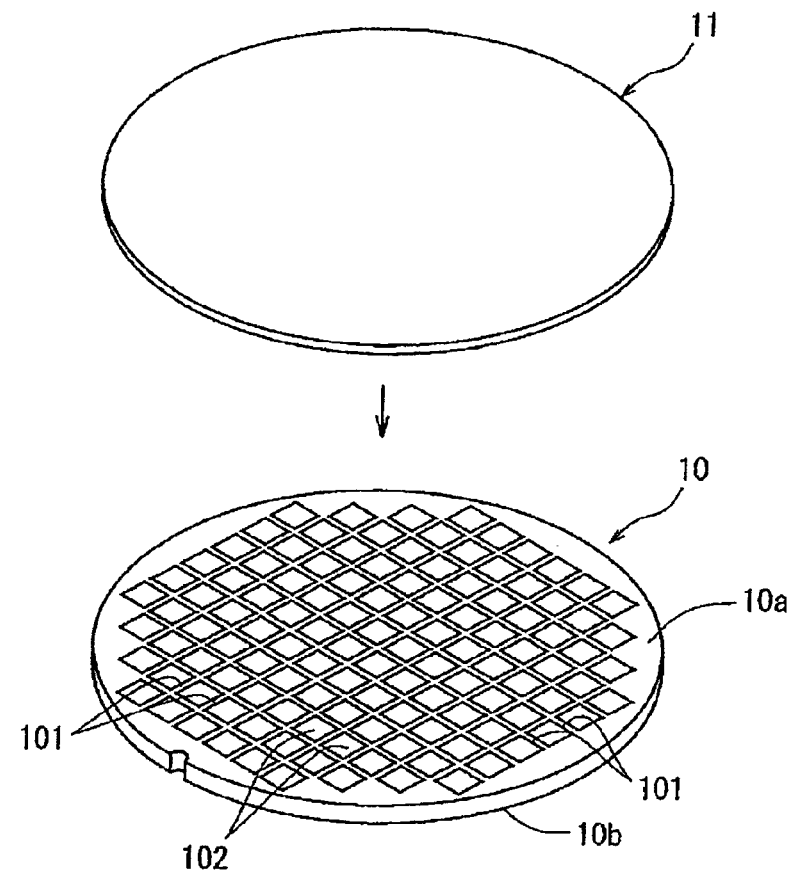
FIG. 3A and FIG. 3B are diagrams of assistance in explaining a protective member sticking process for sticking a protective tape to a front surface of the semiconductor wafer shown in FIG. 2.
Figure 3B:
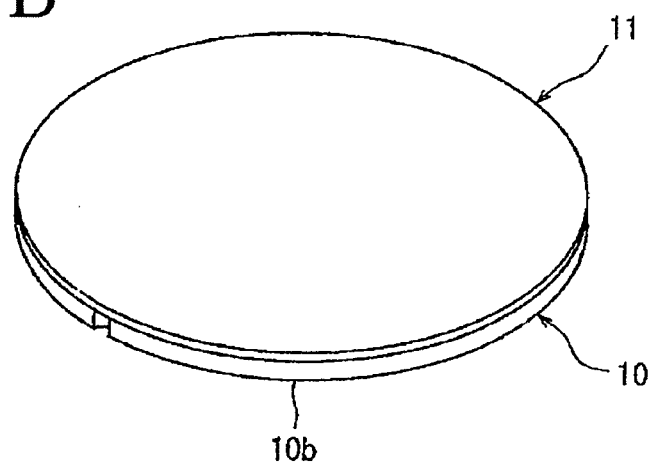

The plasma etching apparatus 2 is constructed as described above. The action of the plasma etching apparatus 2 will be described in the following. FIG. 2 is a perspective view of a semiconductor wafer as a wafer. The semiconductor wafer 10 shown in FIG. 2 is formed by a silicon wafer having a diameter of 200 mm and a thickness of 700 μm, for example. A plurality of predetermined division lines 101 are formed in a lattice manner on a front surface 10a of the semiconductor wafer 10, and devices 102 such as ICs and LSIs are formed in a plurality of regions divided by the plurality of predetermined division lines 101. As shown in FIGS. 3A and 3B, a protective tape 11 as a protective member for protecting the devices 102 is stuck to the front surface 10a of the thus formed semiconductor wafer 10 (protective member sticking process). After the protective tape 11 is thus stuck to the front surface 10a of the semiconductor wafer 10, a back surface grinding process is performed in which the semiconductor wafer 10 is formed with a predetermined finished thickness (for example 350 μm) by grinding a back surface 10b of the semiconductor wafer 10. The back surface grinding process can be performed by using a conventionally well-known grinding device.

Figure 4A:
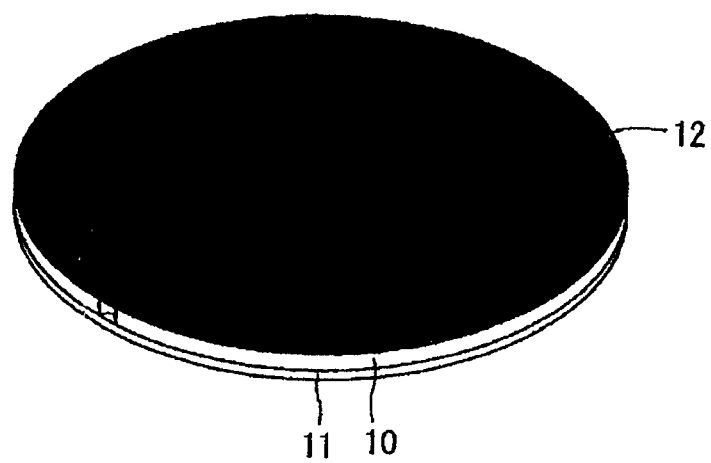
FIG. 4A and FIG. 4B are diagrams of assistance in explaining a resist film coating process for coating, with a resist film, regions excluding regions corresponding to predetermined division lines in a back surface of the semiconductor wafer shown in FIG. 2.
Figure 4B:
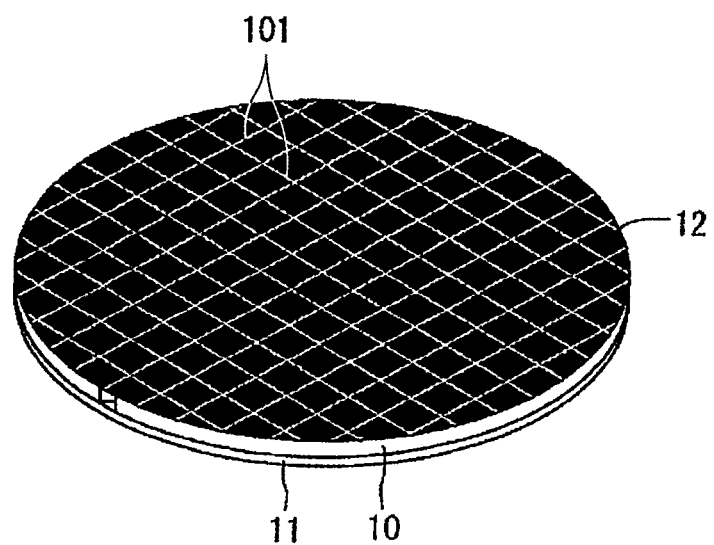

After the semiconductor wafer 10 is formed with the predetermined finished thickness of the devices by grinding the back surface 10b of the semiconductor wafer 10 as described above, a resist film coating process is performed in which regions excluding regions corresponding to the predetermined division lines 101 in the back surface 10b of the semiconductor wafer 10 are coated with a resist film. In the resist film coating process, first, as shown in FIG. 4A, a photoresist film 12 is formed by applying a positive photoresist to the back surface 10b of the semiconductor wafer 10 (photoresist applying process). Next, the photoresist film 12 is exposed to light while regions excluding regions corresponding to the predetermined division lines 101 as regions to be etched in the photoresist film 12 formed on the back surface 10b of the semiconductor wafer 10 are masked (exposure process). The exposed photoresist film 12 is developed with an alkaline solution (development process). As a result, as shown in FIG. 4B, the exposed regions corresponding to the predetermined division lines 101 in the photoresist film 12 are removed. Hence, the regions excluding the regions corresponding to the predetermined division lines 101 in the back surface 10b of the semiconductor wafer 10 are coated with the photoresist film 12.

Description will next be made of an etching process in which the semiconductor wafer 10 is divided into individual devices along the predetermined division lines 101 by etching the semiconductor wafer 10, whose regions excluding the regions corresponding to the predetermined division lines 101 in the back surface 10b are coated with the photoresist film 12 as a result of the resist film coating process being performed as shown in FIG. 4A and FIG. 4B described above, along the predetermined division lines 101 using the plasma etching apparatus 2 shown in FIG. 1 described above.

First, the control means 8 moves the gate 35 downward in FIG. 1 by actuating the gate actuating means 36, and thus opens the opening 341 provided in the right side wall 34 of the housing 3. Next, the semiconductor wafer 10 that has been subjected to the above-described resist film coating process is carried through the opening 341 into the plasma processing chamber 30 formed by the housing 3 by carrying-in-and-out means not shown in the figure, and the semiconductor wafer 10 is mounted on the workpiece retaining table 51 forming the first electrode unit 5 such that the side of the protective tape 11 stuck to the front surface 10a of the semiconductor wafer 10 is on the workpiece retaining table 51. Then, the control means 8 makes the electrostatic chuck of the workpiece retaining table 51 function, whereby the semiconductor wafer 10 mounted on the workpiece retaining table 51 is retained by the electrostatic chuck via the protective tape 11. Hence, the photoresist film 12, with which the regions excluding the predetermined division lines 101 in the back surface 10b of the semiconductor wafer 10 retained on the workpiece retaining table 51 are coated, is on an upper side.

After the semiconductor wafer 10 is thus retained on the workpiece retaining table 51, the control means 8 moves the gate 35 upward in FIG. 1 by actuating the gate actuating means 36, and thus closes the opening 341 provided in the right side wall 34 of the housing 3. Next, the control means 8 reduces the pressure within the plasma processing chamber 30 formed by the housing 3 to a pressure of 20 Pa, for example, by actuating the pressure reducing means 4. Then, an etching process is performed in which the semiconductor wafer 10 is divided into individual devices along the predetermined division lines 101.

In performing the etching process, the control means 8 controls means constituting the first processing gas supply means 71 and the second processing gas supply means 72 to alternately inject the processing gas formed of the $SF_6$ gas and the $O_2$ gas and the processing gas formed of the $C_4F_8$ gas and the $O_2$ gas from the central injecting portion 611 and the peripheral injecting portion 612 into the plasma processing chamber 30 through the first passage 62 and the second passage 63 provided in the second electrode unit 6, as will be described later. In addition, the control means 8 controls the high-frequency power supply 50 and the high-frequency power supply 60 to apply a high-frequency power of 50 w with a frequency of 13 MHz to the first electrode unit 5 and apply a high-frequency power of 3000 w with a frequency of 13 MHz to the second electrode unit 6.

Description in the following will be made of a procedure for injecting the processing gas formed of the $SF_6$ gas and the $O_2$ gas and the processing gas formed of the $C_4F_8$ gas and the $O_2$ gas to be injected into the plasma processing chamber 30 by the first processing gas supply means 71 and the second processing gas supply means 72.

The control means 8 controls the first diaphragm valve 718a at an opening and closing frequency of 100 Hz, for example, and controls the second diaphragm valve 718b at an opening and closing frequency of 50 Hz, for example. The control means 8 activates the control for one second and stops the control for two seconds. The control means 8 repeats the activation for one second and the stop for two seconds. As a result, the processing gas formed of the $SF_6$ gas and the $O_2$ gas is injected with the frequency of 100 Hz from the central injecting portion 611 into the plasma processing chamber 30 via the throttle valve 719 and the first passage 62 for one second at intervals of two seconds, and the processing gas formed of the $SF_6$ gas and the $O_2$ gas is injected with the frequency of 50 Hz from the peripheral injecting portion 612 into the plasma processing chamber 30 via the throttle valve 719 and the second passage 63 for one second at intervals of two seconds.

In addition, the control means 8 controls the first diaphragm valve 728a at an opening and closing frequency of 50 Hz, for example, and controls the second diaphragm valve 728b at an opening and closing frequency of 30 Hz, for example. The control means 8 stops the control for one second as the activation period of the first diaphragm valve 718a and the second diaphragm valve 718b, and activates the control for two seconds as the stop period of the first diaphragm valve 718a and the second diaphragm valve 718b. The control means 8 repeats the stop for one second and the activation for two seconds. As a result, the processing gas formed of the $C_4F_8$ gas and the $O_2$ gas is injected with the frequency of 50 Hz from the central injecting portion 611 into the plasma processing chamber 30 via the throttle valve 729 and the first passage 62 for two seconds at intervals of one second, and the processing gas formed of the $C_4F_8$ gas and the $O_2$ gas is injected with the frequency of 30 Hz from the peripheral injecting portion 612 into the plasma processing chamber 30 via the throttle valve 729 and the second passage 63 for two seconds at intervals of one second. Incidentally, the first processing gas supply means 71 and the second processing gas supply means 72 in the present embodiment supply the processing gas formed of the $SF_6$ gas and the $O_2$ gas to be injected into the plasma processing chamber 30 at a rate of ten liters per minute and supply the processing gas formed of the $C_4F_8$ gas and the $O_2$ gas at a rate of 0.7 liter per minute.

Figure 5:
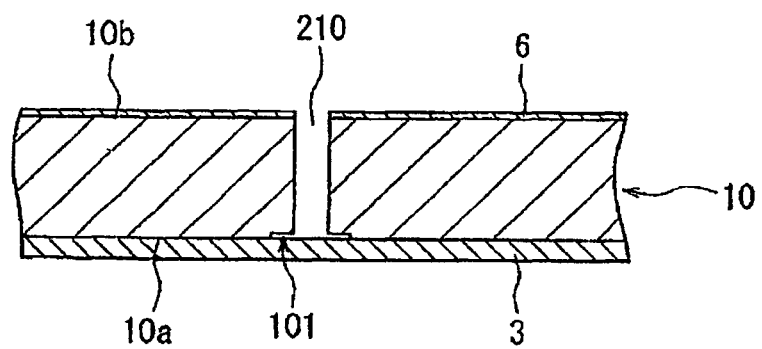
FIG. 5 is a sectional view showing, in enlarged dimension, principal parts of the semiconductor wafer etched by the plasma etching apparatus shown in FIG. 1.

In a state in which the processing gas formed of the $SF_6$ gas and the $O_2$ gas and the processing gas formed of the $C_4F_8$ gas and the $O_2$ gas for plasma generation are alternately supplied to the plasma processing chamber 30 from the central injecting portion 611 and the peripheral injecting portion 612, the control means 8 controls the high-frequency power supply 50 and the high-frequency power supply 60 to apply a high-frequency power of 50 w with a frequency of 13 MHz to the first electrode unit 5 and apply a high-frequency power of 3000 w with a frequency of 13 MHz to the second electrode unit 6. Thus, a plasma formed of the $SF_6$ gas and the $C_4F_8$ gas is generated in a space between the first electrode unit 5 and the second electrode unit 6. The active substance in the plasma state acts on the semiconductor wafer 10 through the regions corresponding to the predetermined division lines 101 in the photoresist film 12 formed on the back surface 10b of the semiconductor wafer 10. Therefore, as shown in FIG. 5, the semiconductor wafer 10 is subjected to etching removal along the predetermined division lines 101, whereby a dividing groove 210 is formed. The semiconductor wafer 10 is thus divided into individual devices 102. Incidentally, a dividing groove of 350 μm can be formed in the silicon wafer by performing the plasma etching processing for 20 minutes while controlling the means constituting the first processing gas supply means 71 and the second processing gas supply means 72 as described above.

As described above, in the plasma etching apparatus 2 according to the present embodiment, the processing gas formed of the $SF_6$ gas and the $O_2$ gas and the processing gas formed of the $C_4F_8$ gas and the $O_2$ gas for plasma generation which processing gases are injected into the plasma processing chamber 30 are supplied from the central injecting portion 611 and the peripheral injecting portion 612 at the predetermined opening and closing frequencies. The processing gases injected into the plasma processing chamber 30 are therefore agitated sufficiently. Thus, an etching rate can be made uniform in each part of the semiconductor wafer 10.

The present invention has been described above on the basis of the illustrated embodiment. However, the present invention is not limited to only the embodiment, but is susceptible of various modifications within the scope of the spirit of the present invention. For example, the foregoing embodiment represents an example in which the first processing gas supply means 71 and the second processing gas supply means 72 are provided. However, a processing gas may be injected into the plasma processing chamber 30 from the central injecting portion 611 and the peripheral injecting portion 612 alternately by one processing gas supply means.

In addition, the foregoing embodiment represents an example in which the first electrode unit 5 as the workpiece retaining means for retaining a workpiece is disposed on the lower side, and the second electrode unit 6 as the processing gas injecting means including the processing gas jetting portion 61 for injecting a processing gas for plasma generation onto the workpiece retained by the workpiece retaining means is disposed on the upper side. However, the first electrode unit 5 as the workpiece retaining means may be disposed on the upper side, and the second electrode unit 6 as the processing gas injecting means may be disposed on the lower side.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A plasma etching apparatus comprising:
a housing defining a plasma processing chamber;
workpiece retaining means for retaining a workpiece on an upper surface of the workpiece retaining means, the workpiece retaining means being disposed within the plasma processing chamber;
processing gas injecting means for injecting a processing gas for plasma generation onto the workpiece retained by the workpiece retaining means, the processing gas injecting means having a processing gas jetting portion including a central injecting portion and a peripheral injecting portion surrounding the central injecting portion;
processing gas supply means for supplying the processing gas to the processing gas injecting means, the processing gas supply means including a processing gas supply source, a buffer tank communicating with the processing gas supply source and temporarily containing the processing gas, a central injecting portion supply path making the buffer tank and the central injecting portion communicate with each other, a peripheral injecting portion supply path making the buffer tank and the peripheral injecting portion communicate with each other, a first high-frequency opening and closing valve disposed in the central injecting portion supply path, a second high-frequency opening and closing valve disposed in the peripheral injecting portion supply path, and control means for controlling an opening and closing frequency of the first high-frequency opening and closing valve at a first frequency and an opening and closing frequency of the second high-frequency opening and closing valve at a second frequency, and wherein the first frequency is different from the second frequency; and pressure reducing means for reducing a pressure within the plasma processing chamber.

2. The plasma etching apparatus according to claim 1, wherein the processing gas supply means includes a first processing gas supply source supplying a first processing gas, a second processing gas supply source supplying a second processing gas, gas mixing means for mixing the first processing gas and the second processing gas with each other, a processing gas communicating path making the gas mixing means and the buffer tank communicate with each other, and pressure adjusting means for adjusting a pressure of the processing gas to be supplied to the buffer tank, the pressure adjusting means being disposed in the processing gas communicating path.

3. The plasma etching apparatus according to claim 1, wherein a plurality of processing gas supply means are provided, and the control means controls the opening and closing frequency of the first high-frequency opening and closing valve and the opening and closing frequency of the second high-frequency opening and closing valve, the first high-frequency opening and closing valve and the second high-frequency opening and closing valve being disposed respectively in the central injecting portion supply path and the peripheral injecting portion supply path of each processing gas supply means.

4. A plasma etching apparatus comprising:
a housing defining a plasma processing chamber;
workpiece retaining means for retaining a workpiece on an upper surface of the workpiece retaining means, the workpiece retaining means being disposed within the plasma processing chamber;
processing gas injecting means for injecting a processing gas for plasma generation onto the workpiece retained by the workpiece retaining means, the processing gas injecting means having a processing gas jetting portion including a central injecting portion and a peripheral injecting portion surrounding the central injecting portion;
processing gas supply means for supplying the processing gas to the processing gas injecting means, the processing gas supply means including a processing gas supply source, a buffer tank communicating with the processing gas supply source and temporarily containing the processing gas, a central injecting portion supply path making the buffer tank and the central injecting portion communicate with each other, a peripheral injecting portion supply path making the buffer tank and the peripheral injecting portion communicate with each other, a first high-frequency opening and closing valve disposed in the central injecting portion supply path, a second high-frequency opening and closing valve disposed in the peripheral injecting portion supply path, and control means for controlling an opening and closing frequency of the first high-frequency opening and closing valve and an opening and closing frequency of the second high-frequency opening and closing valve; and pressure reducing means for reducing a pressure within the plasma processing chamber, and further wherein said processing gas supply means comprises a first processing gas supply means and a second processing gas supply means, and wherein the control means controls:
the opening and closing frequency of the first high-frequency opening and closing valve and the opening and closing frequency of the second high-frequency opening and closing valve of the first processing gas supply means, and the opening and closing frequency of the first high-frequency opening and closing valve and the opening and closing frequency of second high-frequency opening and closing valve of the second processing gas supply means, and wherein the control means alternatively controls the first processing gas supply means and the second processing gas supply means such that gas from the buffer tank associated with the first processing gas supply means and gas from the buffer tank associated with the second gas supply means are alternatively provided to the plasma processing chamber.

5. The plasma etching apparatus according to claim 4, wherein each of the first and second processing gas supply means includes a first processing gas supply source supplying a first processing gas, a second processing gas supply source supplying a second processing gas, gas mixing means for mixing the first processing gas and the second processing gas with each other, a processing gas communicating path making the gas mixing means and the buffer tank communicate with each other, and pressure adjusting means for adjusting a pressure of the processing gas to be supplied to the buffer tank, the pressure adjusting means being disposed in the processing gas communicating path.

6. The plasma etching apparatus according to claim 4, wherein the control means controls:
the opening and closing frequency of the first high-frequency opening and closing valve of the first processing gas supply means at a first frequency; and
the opening and closing frequency of the second high-frequency opening and closing valve of the first processing gas supply means at a second frequency, and
wherein the first frequency is different from the second frequency.

7. The plasma etching apparatus according to claim 4, wherein the control means controls:
the opening and closing frequency of the first high-frequency opening and closing valve of the first processing gas supply means at a first frequency;
the opening and closing frequency of the second high-frequency opening and closing valve of the first processing gas supply means at a second frequency;
the opening and closing frequency of the first high-frequency opening and closing valve of the second processing gas supply means at a third frequency; and
the opening and closing frequency of the second high-frequency opening and closing valve of the second processing gas supply means at a fourth frequency.

8. The plasma etching apparatus according to claim 4, wherein at least two of the following frequencies differ from each other: the first frequency, the second frequency, the third frequency, and the fourth frequency.

9. The plasma etching apparatus according to claim 7, wherein:
the first frequency is 100 Hz;
the second frequency is 50 Hz;
the third frequency is 50 Hz; and
the fourth frequency is 30 Hz.

10. The plasma etching apparatus according to claim 4, wherein the control means:
controls the first processing gas supply means to provide gas from the buffer tank associated with the first processing gas supply means to the plasma processing chamber during a first period and to not provide gas from the buffer tank associated with the first processing gas supply means to the plasma processing chamber during a second period; and
controls the second processing gas supply means to not provide gas from the buffer tank associated with the second processing gas supply means to the plasma processing chamber during the first period and to provide gas from the buffer tank associated with the second processing gas supply means to the plasma processing chamber during the second period.

11. The plasma etching apparatus according to claim 10, wherein:
the first period comprises one second; and
the second period comprises two seconds.

12. The plasma etching apparatus according to claim 1, wherein:
the first frequency comprises 100 Hz; and
the second frequency comprises 50 Hz.

13. The plasma etching apparatus according to claim 1, wherein:
the first frequency comprises 50 Hz; and
the second frequency comprises 30 Hz.

\* \* \* \* \*